(12) United States Patent
Scholtz et al.

(10) Patent No.: US 7,499,816 B2
(45) Date of Patent: Mar. 3, 2009

(54) ESTIMATION OF REAL-TIME POWER SYSTEM QUANTITIES USING TIME-SYNCHRONIZED MEASUREMENTS

(75) Inventors: Ernst Scholtz, Raleigh, NC (US);
Reynaldo F. Nuqui, Cary, NC (US);
John D. Finney, Raleigh, NC (US);
Mats Larsson, Baden (CH); Mani Subramanian, Sugar Land, TX (US);
Gordon Lin, Sugar Land, TX (US)

(73) Assignee: ABB Research Ltd., Zurich (CH)

( * ) Notice: Subject to any disclaimer, the term of this patent is extended or adjusted under 35 U.S.C. 154(b) by 0 days.

(21) Appl. No.: 11/609,393

(22) Filed: Dec. 12, 2006

(65) Prior Publication Data
US 2008/0140326 A1 Jun. 12, 2008

(51) Int. Cl.
*G06F 3/00* (2006.01)
(52) U.S. Cl. .............................. 702/60; 702/57; 702/64; 702/65
(58) Field of Classification Search .................. 702/59, 702/65, 75, 106, 178, 182, 185, 60, 64, 189, 702/57; 700/291, 294; 361/65, 66; 709/217–219; 715/965, 966
See application file for complete search history.

(56) References Cited

U.S. PATENT DOCUMENTS

| | | | |
|---|---|---|---|
| 6,694,270 B2 * | 2/2004 | Hart | 702/57 |
| 6,985,800 B2 * | 1/2006 | Rehtanz et al. | 700/292 |
| 7,233,843 B2 * | 6/2007 | Budhraja et al. | 700/291 |

OTHER PUBLICATIONS

Nuqui Reynaldo, State Estimation and Voltage Security Monitoring Using Synchronized Phasor Measurements, Jul. 2, 2001, Virginia Polytechnic Institute and State University, pp. I-XIV and 1-206.*
Slutsker, et al., Implementation of Phasor Measurements in State Estimator at Sevillana de Electricidad, Power Industry Computer Application Conference, 1995, Conference Proceedings,1995, IEEE, May 7-12, 1995, pp. 392-398.
Reynaldo Francisco Nuqui, State Estimation and Voltage Security Monitoring Using Synchronized Phasor Measurements, Dissertation submitted to the Faulty of the Virginia Polytechnic Institute and State University in partial fulfillment of the requirements for the degree of Doctor of Philosophy in Electrical Engineering, Jul. 2, 2001, 220 pages, Blacksburg Virginia.
Meliopoulos, et al., Visualization and Animation of State Estimation Performance, Presented at 38th Annual Hawaii International Conference on Systems Science, Jan. 5-8, 2005, pp. 1-8.
Novosel, et al., Performance Requirements Part II Targeted Application : State Estimation, Eastern Interconnection Phasor Project Performance Requirements Task Team (PRTT), May 20, 2006, pp. 1-53.
Wu et al., PMU Impact on State Estimation Reliability for Improved Grid Security, PES TD 2005/2006, IEEE, May 21-24, 2006, pp. 1349-1351.

* cited by examiner

*Primary Examiner*—Eliseo Ramos Feliciano
*Assistant Examiner*—Felix E Suarez
(74) *Attorney, Agent, or Firm*—Del Zoppo, III; Anthony M. Driggs, Hogg, Daugherty & Del Zoppo Co., L.P.A.

(57) ABSTRACT

Phasor measurement units (108) provide phasor data from various locations (102) in an electrical power system. The phasor data is referenced to a common timing signal. Non-phasor measurement data is also obtained at various locations in the power system. A phasor assisted state estimator (120) uses the phasor data and the non-phasor data to determine the power system state.

38 Claims, 5 Drawing Sheets

US 7,499,816 B2

ESTIMATION OF REAL-TIME POWER SYSTEM QUANTITIES USING TIME-SYNCHRONIZED MEASUREMENTS

BACKGROUND

The present application relates to the use of phasor measurements in electrical power system state estimation. It finds particular application to the integration of voltage and current phasors in the state estimation process.

Power system state information plays an important role in the operation and analysis of electrical power systems. Indeed, state information can be used for a number of purposes, including system security and contingency analyses, system optimization, and even the creation and operation of markets for electrical energy.

Traditionally, state estimators have performed an indirect estimation of the power system state (i.e., voltage magnitude and angles at the network buses, tap positions of tap changing transformers, etc.) using non-phasor measurements such as power flows and voltage and current magnitudes, to name a few. More recently, however, phasor measurement units (PMUs) have been developed. PMUs provide time-stamped measurements of voltage and current phasors at various locations in the power system. This additional information can be used to improve the network state estimation.

One of the difficulties inherent in providing phase angle measurements in a widely dispersed system, however, is the need to synchronize the measurements to a common reference frame. To this end, PMUs have provided phasor measurements which are synchronized based on time signals from the global positioning system (GPS). Moreover, the Institute of Electrical and Electronics Engineers (IEEE) Synchrophasor standard defines a phasor's instantaneous phase angle in relation to Universal Time Coordinated (UTC), hence fixing the frame of reference for the PMU phasor measurements.

Due to the nature of power system networks, where the power flows on branches on the network are a function of the differences of the voltage phase angles across the branches, a reference or slack bus is chosen in order to render the state estimation problem solvable. Thus, a common reference angle, known as the slack bus angle, has been selected for the state estimation process. While it is generally possible to assign the slack bus angle to an arbitrary value, it is typically set to zero.

As will be appreciated, it is necessary to reconcile the phasor measurement and state estimator reference frames. This can be accomplished by requiring that a reference PMU be placed at the location of the slack bus and computing the angles of the various PMUs with respect to the reference PMU. Unfortunately, however, such an arrangement renders the system vulnerable to the loss of the signal provided by the reference PMU, for example due to an outage at a measurement location, a failure of the reference PMU, or a communication failure. While it is possible to compensate for such a loss, the process for doing so is relatively time-consuming and complex.

SUMMARY

Aspects of the present application address these matters, and others.

According to a first aspect, a method includes estimating a state of an electrical power system and generating an output indicative of the estimated state. The estimation is performed in a state-estimator reference frame using phasor measurement data referenced to a phasor measurement reference frame.

According to another aspect, an apparatus includes a state estimator and means for generating an output indicative of the estimated state. The state estimator estimates a state of an electrical power system in a state-estimator reference frame using phasor measurement data referenced to a phasor measurement reference frame.

According to another aspect a computer readable storage medium contains instructions which, when executed by a computer, cause the computer to carry out a method. The method includes obtaining measurement data functionally related to a state of an electrical power system and using the measurement data to estimate the power system state. The measurement data includes phasor measurements referenced to a phasor measurement reference frame and the estimation is performed in a state-estimator reference frame.

According to another aspect, a method of electrical power system state estimation includes obtaining voltage and current phasor measurements functionally related to a state of an electrical power system. The voltage and current phasor measurements are referenced to a phasor measurement reference frame. The method also includes reconciling the phasor measurement reference frame and a state-estimator reference frame and estimating the power system state.

Those skilled in the art will appreciate still other aspects of the present invention upon reading and understanding the attached figures and description.

FIGURES

The present application is illustrated by way of example and not limitation in the figures of the accompanying drawings, in which like references indicate similar elements and in which.

Figure 5A:
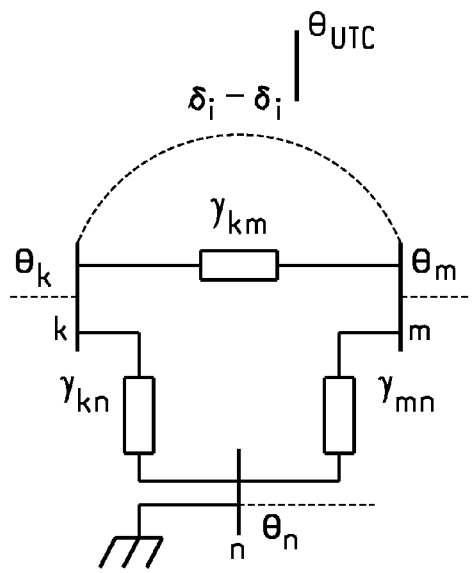
Figure 5B:
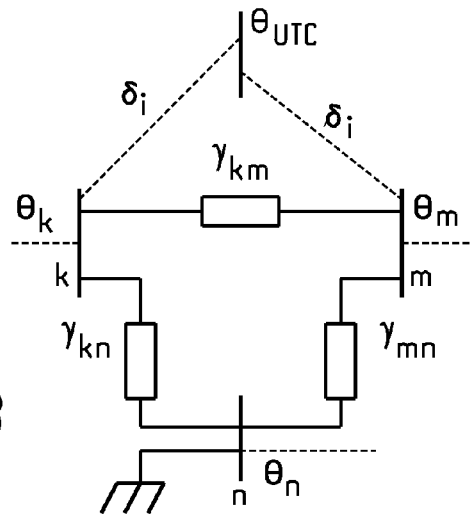
Figure 5C:
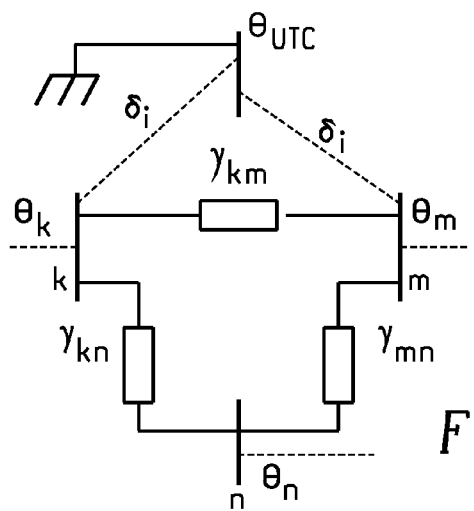

FIGS. 5A, 5B, and 5C illustrate aspects of phasor assisted state estimation.

DESCRIPTION

Time signals measured in a power system network, in their ideal form, are sinusoidal and for instance the voltage at a particular node as a function of time ideally would be of the form:

$$v_i(t) = \sqrt{2} V_i \cos(2\pi f_{sys} t + \theta_i) \qquad \text{Equation 1}$$

where i is the node, t is time, $v_i(t)$ is the time varying voltage, $V_i$ is the root mean square (RMS) magnitude of the voltage, $f_{sys}$ is the system frequency, and $\theta_i$ is a phase angle. Phasor calculus is used to simplify power system analysis. The RMS magnitude and the phase angle of the voltage signal $v_i(t)$ are gathered to form a phasor $V_i e^{\sqrt{-1}\theta_i}$, which is a complex number that has an equivalent real and imaginary component.

For clarity of explanation, the use of phasor measurements in power system state estimation will be described in the context of a fully connected balanced power system that is devoid of equipment such as phase shifting transformers. Such a system with n nodes (also called buses) adheres to the physical laws of Kirchoff and can be described by way of 2n−1 variables that reflect the status of the system. These latter variables are referred to as the states of the power system and they can be denoted as follows:

$$\bar{x}_{\theta_n} = \begin{bmatrix} V_1 \\ \vdots \\ V_n \\ \theta_1 - \theta_n \\ \vdots \\ \theta_{n-1} - \theta_n \end{bmatrix} \quad \text{Equation 2}$$

where $\bar{x}_{\theta_n} \in \Re^{2n-1}$ and the overbar signifies a vector. The reference angle is $\theta_n$ and is sometimes referred to as the slack bus angle. Without loss of generality $\theta_n$ is often chosen to be zero. Use of equipment such as phase shifting transformers, as well as operation in an unbalanced fashion, contributes additional variables to the state vector of the system. Though omitted for clarity of explanation, those of ordinary skill in the art will appreciate that inclusion of these additional variables into the state vector does not detract from the generality of the present application.

Furthermore, various quantities can be expressed as a function of the system state as follows:

$$\bar{w} = \bar{g}(\bar{x}_{\theta_n}) \quad \text{Equation 3}$$

where the elements of $\bar{w}$ are real and the Jacobian matrix $$\frac{\partial \bar{g}}{\partial \bar{x}_{\theta_n}}$$

has rank 2n−1.

Elements of $\bar{w}$ include but are not limited to: active powers $\bar{P}$ flowing on the network branches; reactive powers $\bar{Q}$ on network branches; net active power injections at all network buses $\bar{P}_{inj}$; net reactive power injections at all network buses $\bar{Q}_{inj}$; magnitudes of the voltage phasor at each bus in the network $\bar{V}$; the magnitudes of the current phasors flowing on all the branches of the network $\bar{I}$; phase angles of the voltage phasor at each bus in the network $\bar{\theta}$ relative to the state estimator reference angle; and the phase angles of the current phasor associated with each branch in the network $\bar{\phi}$ relative to the state estimator reference angle.

The power-flow equations of the network are a particular minimal representation of $\bar{g}(\bar{x}_{\theta_n})$ and these equations are derived using Kirchoff's Current Law. The subset of $\bar{w}$ corresponding to these load-flow equations will feature all elements of $\bar{P}_{inj}$ and $\bar{Q}_{inj}$.

As part of the power system state estimation problem a redundant subset, $\bar{y}$ of $\bar{w}$ is measured. The dimension of the vector $\bar{y}$ is larger than or equal to 2n−1, and $\bar{y}$ is expressed as:

$$\bar{y} = \bar{h}(\bar{x}_{\theta_n}). \quad \text{Equation 4}$$

The measurements of the elements of $\bar{y}$ generally have some errors associated with them and these measurements are expressed as:

$$\bar{z}_{TRAD} = \bar{y} + \bar{\epsilon}_{TRAD}, \quad \text{Equation 5}$$

where $\bar{z}_{TRAD}$ is the non-phasor measurement set, and $\bar{\epsilon}_{TRAD}$ is a vector of the associated measurement errors.

The aim of power system state estimation is to find the estimate $\hat{\bar{x}}_{\theta_n}$ of $\bar{x}_{\theta_n}$ via an iterative or other suitable estimation technique using the knowledge of the system (i.e., system model, topology, etc.) and the gathered redundant set of (noisy) measurements. One particular approach that has been adopted in the power system community is to use the method of weighted least squares to find the state estimate $\hat{\bar{x}}_{\theta_n}$.

Figure 1:
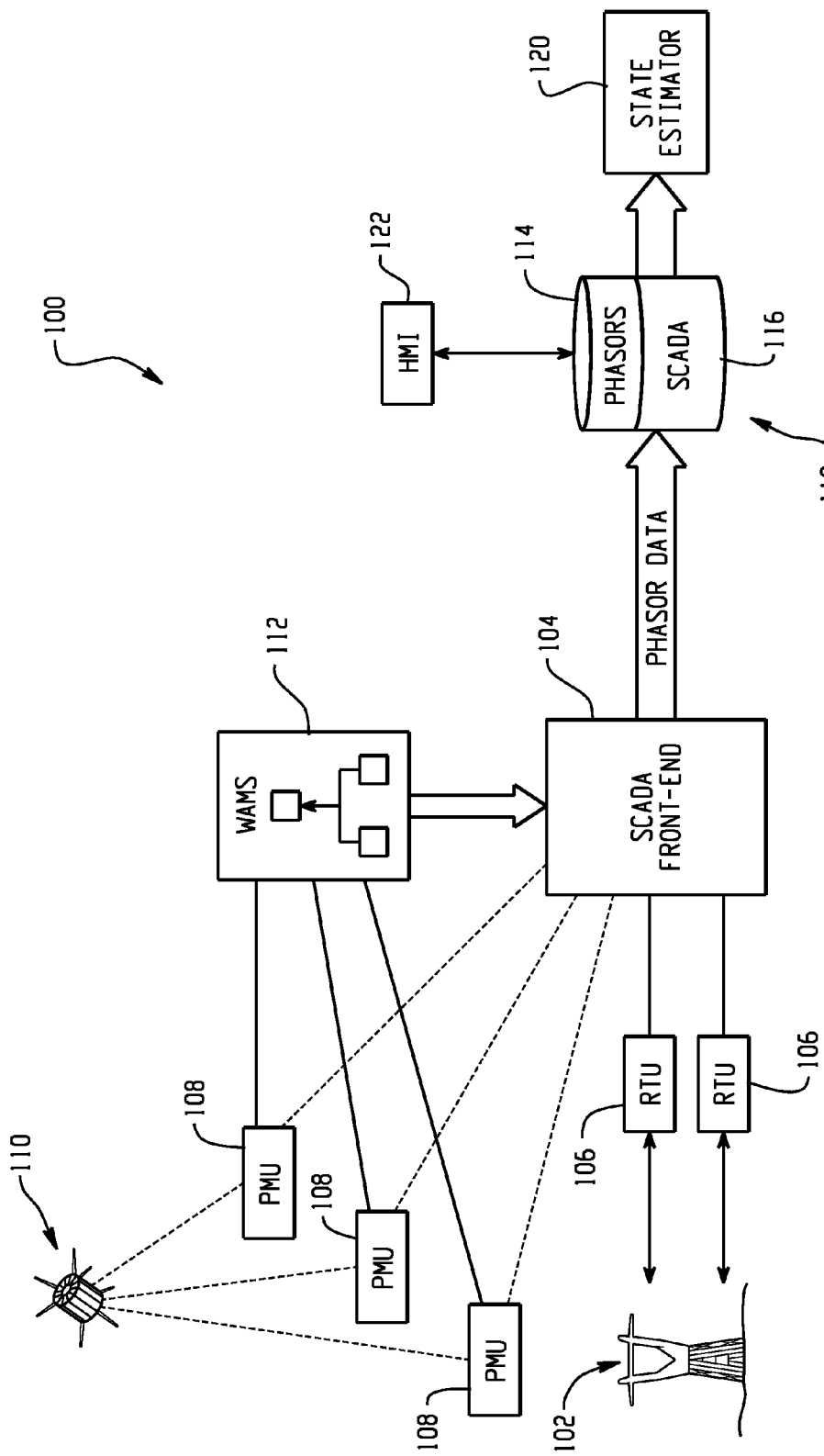
FIG. 1 depicts a system in which phasor data is used to perform an electrical power system state estimation.

While the above discussion has focused on a framework for estimating the power system state using non-phasor measurements, FIG. 1 illustrates a framework for integrating phasor measurements into the state estimation process. As illustrated, an electrical power transmission and distribution system includes a plurality of substations, transmission and distribution lines, and other elements 102. A supervisory control and data acquisition (SCADA) system 104 acquires input data from the various elements 102 via input/output (I/O) interfaces such as remote terminal units (RTUs) 106. In the context of system state estimation, the input data typically includes non-phasor measurements such as voltage and current magnitudes, power flows, and power injection.

In addition, phasor measurement devices such as PMUs 108 calculate phasor measurements at desired locations in the system, with the number and placement of the PMUs generally a function of the network topology, system observability, economics, and other relevant factors. The PMUs 108 provide streams of measurement data which typically include a time stamp, voltage and/or current phasors, and the power system frequency. Where the phasor data is presented in a polar coordinate system, the phasor data includes a phasor angle and magnitude. In the case of a rectangular coordinate system, the phasor data includes the phasor real and imaginary components. As noted above, the phasor data is presented with respect to a phasor measurement reference frame such as a temporal reference frame synchronized with respect to time signals obtained from the GPS system 110. In one implementation, the phasor data is provided according to the IEEE Synchrophasor standard, although other techniques could be used. Some or all of the phasor data may also be obtained from other sources, for example through the known Wide Area Measurement System (WAMS) 112.

As illustrated, the relevant phasor 114 and non-phasor data 116 is stored in a database 118 such as the SCADA system real time database (RTDB) 118 contained in a suitable computer readable memory or memories. A state estimator 120 uses the data 114, 116 to estimate the state of the system, for example using iterative state estimation techniques as are generally known in the art. In one such implementation, the state estimator 120 is implemented by way of computer readable instructions which are stored on a computer readable storage medium accessible to a computer. When executed by the computer, the instructions cause the computer processor(s) to estimate the power system state.

More particularly, and as will be described in greater detail below, the phasor data 116 is advantageously used to augment the traditional, non-phasor measurement based power system state estimation process by appending the phasor data to the non-phasor measurement set to create a combined measurement vector:

$$\bar{z} = \begin{bmatrix} \bar{z}_{TRAD} \\ \bar{z}_{PMU} \end{bmatrix} \quad \text{Equation 6}$$

where $\bar{z}_{TRAD}$ represents traditional non-phasor data and $\bar{z}_{PMU}$ represents the set of phase angle measurements from phasor measurement devices such as PMUs.

The state estimator 120 output is stored to a computer readable memory, for example in the database 118 or otherwise. Some or all of the state estimate information may also be presented in a human perceptible form, for example via a suitable human machine interface (HMI) 122.

Figure 2A:
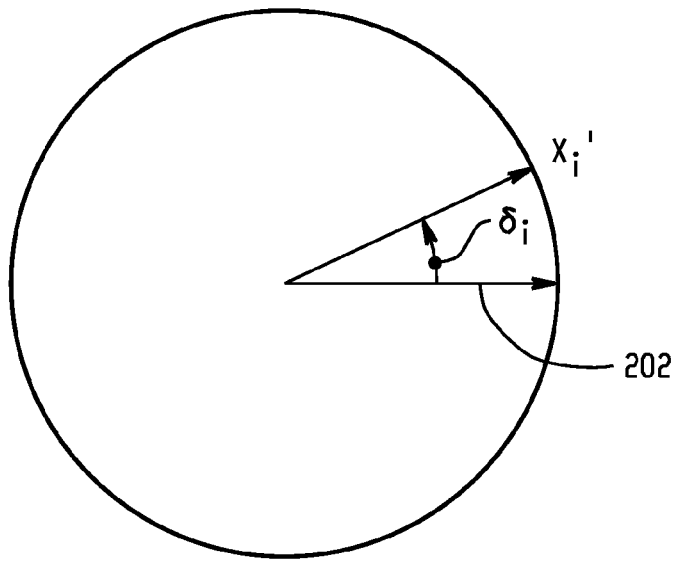
FIGS. 2A and 2B depict a phasor in measurement and state estimator reference frames, respectively.

Turning now to FIG. 2A, a phasor $X_i'$ is depicted in the phasor measurement reference frame relative to a reference angle 202. According to the IEEE Synchrophasor standard, the phase angle of phasor $X_i'$ is defined as the phase shift $\delta_i$ of a cosine time waveform (similar as in Equation 1) with a certain frequency (assume $f_0$ for this discussion) when compared to a cosine time waveform at nominal system frequency $f_0$ synchronized to universal time coordinated (UTC). Moreover this phase shift is expressed as the phase angle $\alpha_i$ which is relative to a reference angle $\alpha_{UTC}$ and for which the following relationship holds:

$$\delta_i = \alpha_i - \alpha_{UTC}. \qquad \text{Equation 7}$$

To use the phasor $X_i'$ in the state estimation process, however, it is desirable that the phase angles $\alpha_i$ and $\alpha_{UTC}$ be mapped to the state-estimator reference frame that is fixed when the value of $\theta_n$ is chosen.

Figure 2B:
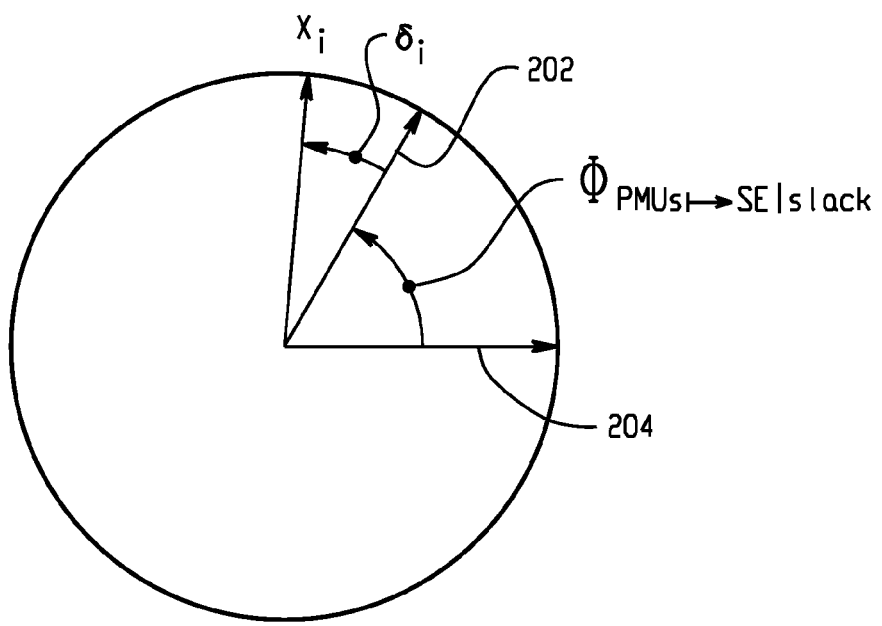

The relationship between these reference frames is depicted in FIG. 2B, in which phasor $X_i$ is shown in relation to the slack bus angle 204. (Note that $\theta_n = 0$ in this figure.) As can be seen, this relationship between the phasor measurement and state-estimator reference frames can be expressed as a rotation or offset of $\Phi_{PMUs \mapsto SE|slack}$. In particular the following mappings of the angles in question hold:

$$\alpha_i \mapsto \theta_k - \theta_n$$

$$\alpha_{UTC} \mapsto \theta_{UTC} - \theta_n \qquad \text{Equation 8}$$

From which we see that $\Phi_{PMUs \mapsto SE|slack} = \theta_{UTC} - \theta_n$.

Thus the phasor voltage angle measurement for each PMU as expressed in the state estimator reference frame can be written as:

$$\delta_i + (\theta_{UTC} - \theta_n) = (\theta_k - \theta_n) \text{ for some } k \in [1, n] \qquad \text{Equation 9}$$

Considering the case where the local system frequency $f_i$, evident in the cosine time waveform where a phasor measurement is computed according to the IEEE Synchrophasor standard, is different from $f_0$ then an additional term should be added to Equation 7 on the left hand side in order to account for an additional angle due to this off-nominal frequency operation. In the IEEE Synchrophasor standard this additional angle is given as:

$$b(f_i, f_0, t) = 2\pi(f_i - f_0)t \qquad \text{Equation 10}$$

The local frequency $f_i$ can be computed (such measurements typically being performed by the various phasor measuring devices or other intelligent electronic devices placed at the same bus), and an angular offset of the form $b(f_i, f_0, t)$ can be compensated for at the phasor measurement device level, the phasor data concentrator (PDC) level, or otherwise. For clarity of the following discussion, it will be assumed that the compensation is performed at the PMU level such that the angular offset due to off-nominal frequency operation is equal to zero. Hence, for the purposes of the present discussion, and neglecting measurement errors, the phasor voltage angle measurement for each PMU can be written as:

$$\delta_i = (\theta_k - \theta_n) + \theta_{REF} \text{ for some } k \in [1, n] \qquad \text{Equation 11}$$

where $\theta_{REF} = (\theta_n - \theta_{UTC})$.

Thus, the reference or translational angle $\theta_{REF}$, which reflects the reconciliation of the phasor measurement reference frame with the reference frame of the state estimator should be accounted for when phase angle measurements from phasor measurement devices are integrated into the state estimator.

One approach for mapping or reconciling the phasor measurement and state-estimator reference frames is to generate a set of pseudo-measurements which describe the angular differences between the outputs of the various phasor measurement devices in the measurement reference frame. The set of angular differences can be described by the following vector:

$$\bar{p} = \begin{bmatrix} \vdots \\ \delta_i - \delta_j \\ \vdots \end{bmatrix}, \qquad \text{Equation 12}$$

where $i, j \in [1, m]$ and there are no restrictions on m (i.e., multiple phasor measurement devices can be located at the same bus). In the equation above the angular differences for each $i, j \in [1, m]$ is of the form $$\delta_i - \delta_j = \theta_k - \theta_m, \qquad \text{Equation 13}$$

for $k, m \in [1, n]$, and in the case that i and j are placed at the same electrical bus then $k = m$ and the angular-difference pseudo-measurement is zero and is excluded from $\bar{p}$. It is evident that the translational angle $\theta_{REF}$ has been eliminated from all the entries in $\bar{p}$ and that $\bar{p}$ is only a function of $\bar{x}_{\theta_n}$. Each measurement $\delta_i$ has some associated error, and these errors feed through to each angular difference pseudo-measurement. The compiled voltage angular-difference pseudo-measurement set is subsequently expressed as:

$$\bar{z}_{PMU,LV}^A = \bar{p}(\bar{x}_{\theta_n}) + \bar{\varepsilon}_{\theta_{PMU}} \qquad \text{Equation 14}$$
$$\text{with } \bar{z}_{PMU,LV}^A \in \bar{z}_{PMU},$$

where $\bar{\varepsilon}_{\theta_{PMU}}$ is a vector whose elements reflect the combined measurement error of the two phase angle measurement errors used in constructing each angular difference.

By appending this additional pseudo-measurement vector $\bar{z}_{PMU}$ to the measurements $\bar{z}_{TRAD}$ (as is shown in Equation 6), as well as using a system model, the estimate $\hat{\bar{x}}_{\theta_n}$ of $\bar{x}_{\theta_n}$ can be found via the weighted least squares or other suitable estimation technique. As will also be appreciated, the pseudo-measurement data as contained in the combined measurement vector is provided with respect to the measurement reference frame.

According to another approach, the measurement and state-estimator reference frames can be directly reconciled. A method to achieve this reconciliation is to view the reference angle $\theta_{REF}$ as an additional state variable that also needs to be estimated, for example by appending $\theta_{REF}$ to the state variable vector as follows:

$$\bar{\chi} = \begin{bmatrix} \bar{x}_{\theta_n} \\ \theta_{REF} \end{bmatrix}, \qquad \text{Equation 15}$$

where $\bar{\chi} \in \Re^{2n}$ and $\theta_{REF} = \theta_n - \theta_{UTC}$.

The voltage phase angle measurements can be expressed as the following vector:

$$z^B_{PMU,LV} = \bar{q}(\bar{\chi}) + \bar{\varepsilon}_{\theta_{PMU}} \text{ where } \bar{q} = \begin{bmatrix} \delta_1 \\ \vdots \\ \delta_m \end{bmatrix}, \quad \text{Equation 16}$$

$$\text{with } z^B_{PMU,LV} \in \bar{z}_{PMU}$$

where $\bar{\varepsilon}_{\theta_{PMU}}$ is a vector whose elements are the measurement errors associated with the applicable voltage phase angle measurement from the phasor measurement device such as a PMU.

By appending this additional measurement vector $\bar{z}_{PMU}$ to the measurements $\bar{z}_{TRAD}$ (as is shown in Equation 6), as well as using a system model, the estimate $\hat{\bar{x}}_{\theta_n}$ of $\bar{x}_{\theta_n}$, as well as the estimate $\hat{\theta}_{REF}$ of $\theta_{REF}$, can be found via the weighted least squares or other suitable estimation technique. Again, it will be appreciated that the phasor measurements of the combined measurement vector are provided with respect to the measurement reference frame.

Another approach to the phasor-assisted state estimation problem is to perform the state estimation in the measurement reference frame. Thus, rather than establishing the state-estimator reference frame with respect to a spatial location in the power system network, the measurement reference frame is used as the state-estimator reference frame. For this choice of reference the state vector can be expressed as:

$$\bar{x}_{\theta_{UTC}} = \begin{bmatrix} V_1 \\ \vdots \\ V_n \\ \theta_1 - \theta_{UTC} \\ \vdots \\ \theta_n - \theta_{UTC} \end{bmatrix}, \quad \text{Equation 17}$$

from which we note that the dimension of $\bar{x}_{\theta_{UTC}} \in \Re^{2n}$ is the same as for $\bar{\chi} \in \Re^{2n}$. From this we see that the state that the voltage angle elements of $\bar{x}_{\theta_{UTC}}$ and $\bar{\chi}$ will be different, but through a similarity transformation can be shown to be related to each other.

It is evident that for this choice of reference that the phase angle measurements from the PMUs or other phasor measurement devices can be directly integrated into the state estimator problem. Investigating Equation 14 it is evident that:

$$z^B_{PMU,LV} = \bar{q}(\bar{x}_{\theta_{UTC}}) + \bar{\varepsilon}_{\theta_{PMU}} \text{ where } \bar{q} = \begin{bmatrix} \delta_1 \\ \vdots \\ \delta_m \end{bmatrix}, \quad \text{Equation 18}$$

$$\text{with } z^B_{PMU,LV} \in \bar{z}_{PMU}$$

where $\bar{\varepsilon}_{\theta_{PMU}}$ is a vector whose elements are the measurement errors associated with the applicable voltage phase angle measurement from the PMUs or other phasor measurement devices.

By appending this additional measurement vector $\bar{z}_{PMU}$ to the measurements $\bar{z}_{TRAD}$ (as is shown in Equation 6), as well as using a system model, the estimate $\hat{\bar{x}}_{\theta_{UTC}}$ of $\bar{x}_{\theta_{UTC}}$ can be found via the weighted least squares or other suitable estimation technique. Again, it will be appreciated that the phasor measurements of the combined measurement vector are provided with respect to the measurement reference frame.

The above-described approaches will now be further illustrated with reference to FIGS. 5A, 5B, and 5C. As illustrated, a portion of the power system includes nodes or busses k, m, and n having respective voltage phase angles $\theta_k$, $\theta_m$, and $\theta_n$. The relationship between the nodes can be expressed by way of network elements $y_{km}$, $y_{kn}$, and $y_{mn}$. The voltage phasor data is measured in relation to the angle $\theta_{UTC}$.

FIG. 5A illustrates the pseudo-measurement approach described above in relation to Equation 12. As indicated for illustrative purposes by the ground symbol, the state estimation is performed with respect to network node n. The expression $\delta_i - \delta_j$ represents an exemplary angular difference between the voltage phasor measurements acquired at nodes k and m. As illustrated by the dashed line, such an approach does not require that the relationship between the state and measurement reference frames be explicitly evaluated. One advantage of such an approach is that the reference frame reconciliation need not be performed with respect to a single physical device or location, thereby producing additional robustness compared to an arrangement which depends on a single device or location to serve as a reference signal. When the estimation is performed via the least squares or a similar technique, the measurement errors associated with the various measurements are generally accounted for during the estimation.

FIG. 5B illustrates the direct reconciliation approach described above in relation to Equation 16. Again as indicated for illustrative purposes by the ground symbol, the state estimate is referenced to network node n. As illustrated, however, the voltage phasor measurements $\delta_i$, $\delta_j$ as used in the state estimation process are referenced to the angle $\theta_{UTC}$, and the reference angle $\theta_{REF}$ which reconciles state estimation and reference frames is treated as a state variable. Again, such an approach does not require that the reconciliation of the reference frames be performed with respect to a single physical device or location. An advantage of treating the reference angle as a state variable is that the construction of a pseudo-measurement set of angular differences can be avoided. In addition, the reference angle $\theta_{REF}$ can be included in a cost function calculation. In the case where the cost function is minimized, the error minimization can be viewed as minimizing an overall error in the state estimate. Moreover, both the non-phasor and phasor data can be used to determine a best fit relationship between the two reference frames.

FIG. 5C depicts the case where the state is estimated in the measurement reference frame as discussed above in relation to Equation 17. As is again indicated for illustrative purposes by the ground symbol, the state estimation is performed with respect to the to the angle $\theta_{UTC}$. As illustrated, the voltage phasor measurements $\delta_i$, and $\delta_j$ as used in the state estimation process are referenced to the angle $\theta_{UTC}$. As the phasor measurements and the state estimations are referenced to the same temporal reference frame, the reconciliation of the measurement and reference frames can be avoided. Moreover, it is not necessary to select a new reference or slack bus in the case of an outage at this selected location. Note that, according to such an approach, the state estimate can be presented in the temporal reference frame. As an alternative, the state estimate may be subsequently presented with respect to a desired power system node (e.g., a slack bus). In the case of an outage at the selected node, the state estimate may be presented in relation to an alternate node.

While the above discussion has focused on the use of voltage phase angle measurements, current angle measurements from phasor measurement devices may also be provided in relation to the phasor measurement set reference frame. A current angle measurement can be expressed as:

$$\psi_s = \phi_{km}(\overline{x}_{\theta_n}) + \theta_{REF}, \quad \text{Equation 19}$$

where $\psi_s$ is a current angle measurement from a phasor measurement device such as a PMU, and $\phi_{km}$ (which is a function of $\overline{x}_{\theta_n}$) is the current angle on the network branch between bus k and m. Note that measurement errors are again omitted for clarity of explanation.

The integration of these current angle measurements into the above-described voltage phasor assisted power system state estimation techniques will be discussed next. In each case, the measurement vector includes additional current angle measurements $\overline{z}_{PMU, \angle I}$.

In the case of the pseudo-measurement technique, the reference angle $\theta_{REF}$ can be eliminated from the measurement expressions by creating by evaluating the following angular differences to create a further pseudo-measurement set:

$$\overline{z}^A_{PMU, \angle I} = \overline{d}(\overline{x}_{\theta_n}) + \overline{\varepsilon}_{\phi PMU} \text{ where, } \overline{d} = \begin{bmatrix} \vdots \\ \psi_s - \delta_1 \\ \vdots \end{bmatrix}, \quad \text{Equation 20}$$

with $\overline{z}^A_{PMU, \angle V} \in \overline{z}_{PMU}$ and $\overline{\varepsilon}_{\phi PMU}$ is a vector whose elements are the measurement errors associated with the applicable voltage phase angle measurement from the phasor measurement device such as a PMU. Where $\delta_i$ is one of the possible voltage phase angles that are being measured at bus k, and the angular-difference elements of $\overline{d}$ are of the form:

$$\psi_s - \delta_i = \phi_{km}(\overline{x}_{\theta_n}) - (\theta_k - \theta_n) \quad \text{Equation 21}$$

from which we note that $\theta_{REF}$ has been eliminated from the expression.

By analogy to Equation 6, the current phasor measurements $\overline{z}_{PMU, \angle I}$ can be included in the measurement vector:

$$\overline{z} = \begin{bmatrix} \overline{z}_{TRAD} \\ \overline{z}_{PMU, \angle V} \\ \overline{z}_{PMU, \angle I} \end{bmatrix}, \quad \text{Equation 22}$$

which is then used in combination with a system model to find the estimate $\hat{\overline{x}}_{\theta_n}$ of $\overline{x}_{\theta_n}$ using the weighted least squares or other suitable estimation technique. It will again be appreciated that, as illustrated in Equation 22, the current and voltage phasor data is provided with respect to the measurement reference frame.

Where the translational angle between the two reference frames are directly reconciled, current angle measurements of the form:

$$\overline{z}^B_{PMU, \angle I} = \overline{b}(\overline{\chi}) + \overline{\varepsilon}_{\phi PMU} \text{ where } \overline{b} = \begin{bmatrix} \psi_1 \\ \vdots \\ \psi_0 \end{bmatrix} \quad \text{Equation 23}$$

with $\overline{z}^B_{PMU, \angle I} \in \overline{z}_{PMU}$ are included in the measurement vector to form a measurement vector analogous to that shown in Equation 22. The measurement vector $\overline{z}$, in combination with a system model, can be used to estimate $\hat{\overline{x}}_{\theta_n}$ of $\overline{x}_{\theta_n}$, as well as the estimate $\hat{\theta}_{REF}$ of $\theta_{REF}$, using the weighted least squares or other suitable estimation technique.

Where the state estimation is performed in the measurement reference frame, current measurements are of the form:

$$\overline{z}^B_{PMU, \angle I} = \overline{b}(\overline{x}_{\theta_{UTC}}) + \overline{\varepsilon}_{\phi PMU} \text{ where } \overline{b} = \begin{bmatrix} \psi_1 \\ \vdots \\ \psi_0 \end{bmatrix}, \quad \text{Equation 24}$$

with $\overline{z}^B_{PMU, \angle I} \in \overline{z}_{PMU}$ are included in the measurement vector to form a measurement vector analogous to that shown in Equation 22. The measurement vector $\overline{z}$, in combination with a system model, can be used to estimate $\hat{\overline{x}}_{\theta_{UTC}}$ of $\overline{x}_{\theta_{UTC}}$, using the weighted least squares or other suitable estimation technique.

Figure 3:
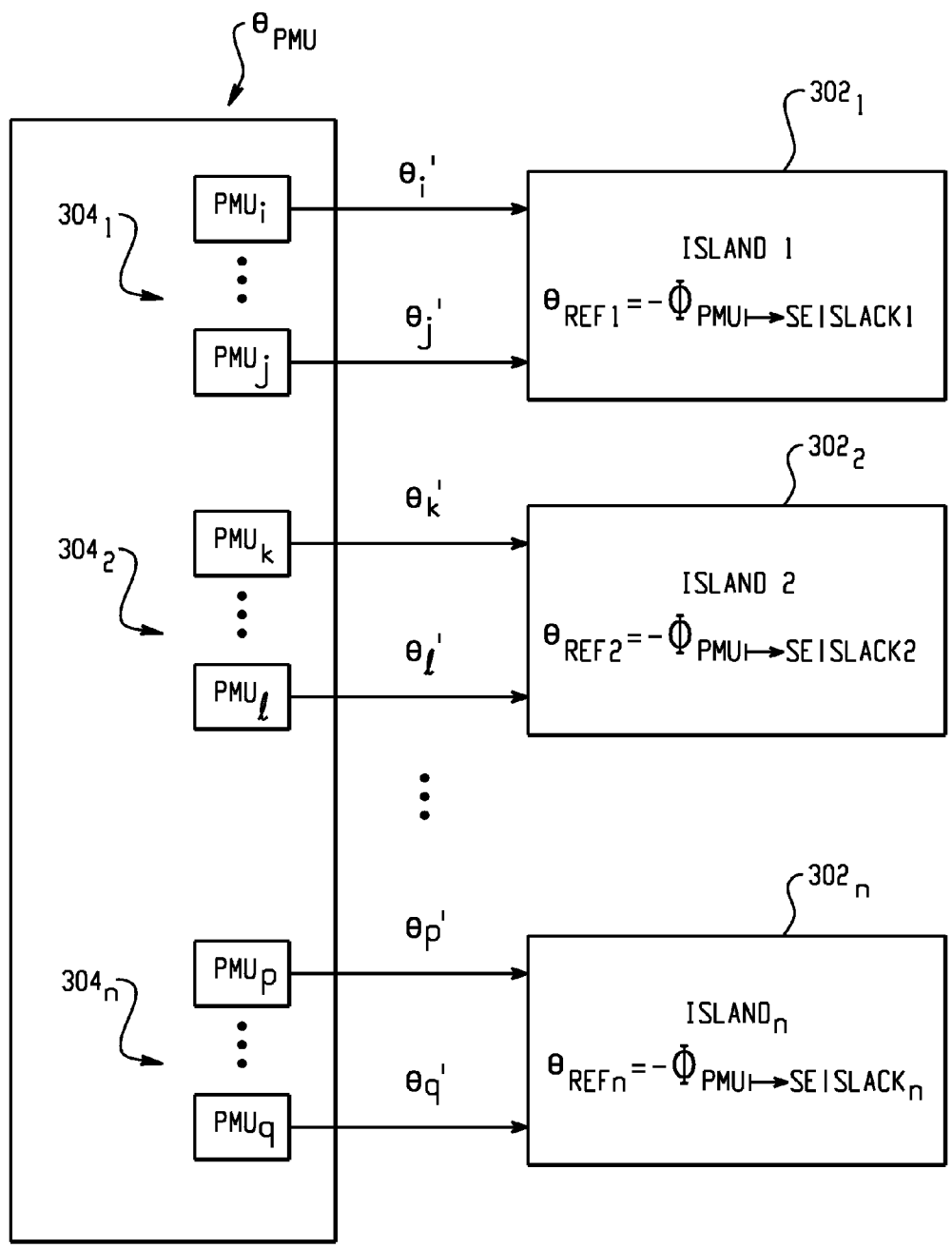
FIG. 3 depicts a system having a plurality of electrical islands.

While the foregoing discussion has focused on a system that is electrically connected, hence having a single electrical island, it is also applicable to systems having two (2) or more electrical islands $302_1, 302_2 \ldots 302_c$ as illustrated in FIG. 3. PMUs $304_1, 304_2 \ldots 304_c$ associated with each island provide phasor data in relation to the phasor measurement frame as described above as illustrated generally by $\theta_{PMU}$. An additional slack bus is advantageously chosen for each island $302_1, 302_2 \ldots 302_c$. A reference/translational angle $$\theta_{REF,i} = -\Phi_{PMUs} \mapsto_{SE \setminus slack,i}, \quad \text{Equation 25}$$

for each electrical island $i \in [1,c]$ exists. The state vector for the system with multiple electrical islands is expressed as:

$$\overline{x}_{\theta_n, \ldots, \theta_{n-c+1}} = \begin{bmatrix} V_1 \\ \vdots \\ V_n \\ \theta_1 - \theta_n \\ \vdots \\ \theta_i - \theta_n \\ \theta_{j+1} - \theta_{n-1} \\ \vdots \\ \theta_{n-c} - \theta_{n-c+1} \end{bmatrix}, \quad \text{Equation 26}$$

where there are j network buses connected in area/island 1, $\overline{x}_{\theta_n}, \ldots, \theta_{n-c+1} \in \Re^{2n-c}$.

Integrating phase angle measurements from phasor measurement units using the method of angular differences as described with Equations 12 and 16 for the case where the system have more than one electrical island can be accomplished using a set of pseudo-measurements whose elements are angular differences of measurements of devices located in the same electrical island. In doing so, $\theta_{REF,i}$ will be eliminated from the respective expressions. Once the pseudo-measurement set is constructed and appended to the measurement vector, the estimate $\hat{\overline{x}}_{\theta_n, \ldots, \theta_{n-c+1}}$ of $\overline{x}_{\theta_n}, \ldots, \theta_{n-c+1}$ can be found using this information as well as knowledge of the system (i.e., topology and system model) by using a suitable estimation technique.

In the case of the direct reconciliation technique, the various reference angles $\theta_{REF,i}$ are included in the state vector as follows:

$$\bar{X} = \begin{bmatrix} \bar{x}_{\theta_n,\ldots,\theta_{n-c+1}} \\ \theta_{REF,1} \\ \vdots \\ \theta_{REF,c} \end{bmatrix}. \quad \text{Equation 27}$$

The phase angle measurements (i.e., the voltages and/or current phasors) from phasor measurement devices are again appended to the measurement vector, and this information in conjunction with knowledge of the system (i.e., topology and system model) is then used to find the estimate $\hat{\bar{x}}_{\theta_n,\ldots,\theta_{n-c+1}}$ of $x_{\theta_n,\ldots,\theta_{n-c+1}}$, as well as all estimates $\hat{\theta}_{REF,i}$ of $\theta_{REF,i}$, using a suitable estimation technique.

In the third method when the reference for the integrated estimation problem is chosen as $\theta_{UTC}$, it can be shown that the state vector $\bar{x}_{\theta_{UTC}}$ can be estimated for a network with c electrical islands as long as there is at least one phasor measurement in each electrical island. For this setup there will be one global reference $\theta_{UTC}$.

Figure 4:
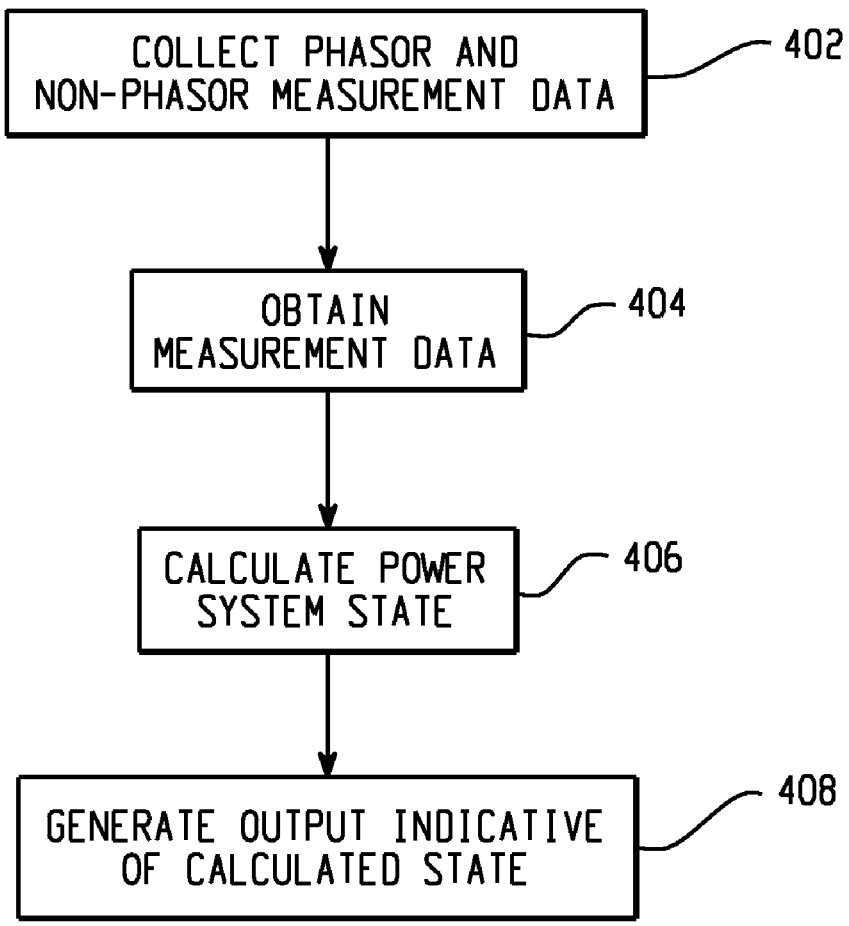
FIG. 4 depicts a state estimation method.

Operation will now be described in relation to FIG. 4. Phasor and non-phasor measurement data is collected at step 402. As noted above, the phasor data includes measurements which are synchronized to a phasor measurement reference frame. Also as described, the collected data is stored in a suitable computer readable memory, for example in a SCADA system RTDB 116.

A measurement data vector is generated at step 404. As described above, the data includes vector includes both non-phasor and phasor data. The phasor data, which may include voltage and/or current phasors, is referenced to a reference frame other than the state-estimator reference frame, for example a measurement reference frame synchronized to UTC. Where angular difference pseudo-measurements are used, the phasor data includes a set of angular differences between the various phasor measurements. In the case of a direct reconciliation, or where the state estimation is performed in relation to the measurement reference frame, the various phasor measurements may be used directly.

The power system state is calculated at step 406, for example using a conventional iterative state estimation algorithm which operates on the measurement data vector. In the case of the direct reconciliation approach, a reconciliation angle $\theta_{REF}$ which reconciles the state estimation and measurement is treated as an additional state variable to be estimated.

An output indicative of the power system state is generated at step 408 and optionally presented in human readable form via a suitable HMI.

Of course, modifications and alterations will occur to others upon reading and understanding the preceding description. It is intended that the invention be construed as including all such modifications and alterations insofar as they come within the scope of the appended claims or the equivalents thereof.

What is claimed is:

1. A method comprising:
   obtaining non-phasor measurement data about an electrical power system;
   obtaining phasor measurement data about the electrical power system;
   estimating a state of the electrical power system directly from both the non-phasor and phasor data using a statistical estimation algorithm, wherein the estimation is performed in a state-estimator reference frame using phasor measurement data referenced to a phasor measurement reference frame; and
   generating an output indicative of the estimated state.

2. The method of claim 1 wherein the phasor measurement data includes voltage phasor data and current phasor data, including current phasor angle, the phasor measurement data is represented in polar coordinates, and the statistical algorithm includes is a weighted non-linear least squares algorithm.

3. The method of claim 1 wherein the phasor measurement reference frame and state-estimator reference frames are different.

4. The method of claim 1 wherein the state-estimator reference frame is referenced to a node of the electrical power system and the phasor measurement frame is referenced to a temporal reference.

5. The method of claim 1 wherein the estimation is performed iteratively using phasor measurement data referenced to a temporal reference frame.

6. The method of claim 1 wherein the phasor measurement data includes, for each of a plurality of voltage phasor measurements, angular differences between the voltage phasor measurement and a plurality of other voltage phasor measurements.

7. The method of claim 1 wherein the phasor measurement data includes, for each of a plurality of voltage angle measurements, an angular difference between a current angle measurement and the voltage angle measurement.

8. The method of claim 1 including generating a set of pseudo-measurements which describes the angular differences between each of a plurality of pairs of voltage phasor measurements in the measurement reference frame and wherein the estimation is performed using the pseudo-measurements.

9. The method of claim 1 wherein the electrical power network includes first and second electrical islands and the phasor measurement data includes a first set of angular differences between phasor measurements from the first electrical island and a second set of angular differences between phasor measurements from the second electrical island.

10. The method of claim 1 wherein the estimation is performed with reference to a reference bus and the phasor measurement data does not include a phasor measurement from the reference bus.

11. The method of claim 1 wherein estimating includes estimating a value of a state variable which reconciles the phasor measurement and state-estimator reference frames.

12. The method of claim 11 wherein the phasor measurement data includes a plurality of phase angle measurements which are synchronized to a temporal reference.

13. The method of claim 12 wherein the non-phasor measurement data is collected by a remote terminal unit and the phasor measurement data is obtained by a phasor measurement device.

14. The method of claim 11 wherein the state variable is an angle.

15. The method of claim 1 wherein the estimating includes iteratively estimating an angle which reconciles the state estimation and the measurement reference frame.

16. The method of claim 1 including simultaneously iteratively estimating the power system state and a value which reconciles the state estimation and the measurement reference frames.

17. The method of claim 1 wherein the state estimation is performed in the measurement reference frame.

18. The method of claim 1 wherein the state estimation is performed in a temporal reference frame.

19. The method of claim 18 wherein the method includes presenting the state estimate in the temporal reference frame.

20. The method of claim 1 including obtaining phasor and non-phasor measurement data from a database of a SCADA system.

21. An apparatus comprising:
a state estimator that employs a weighted non-linear least squares algorithm to estimate a state of an electrical power system in a state-estimator reference frame as a function of both non-phasor measurement data, including voltage and current magnitude, and phasor measurement data, including voltage and current magnitudes and angles in polar coordinates, which is referenced to a phasor measurement reference frame;
means for generating an output indicative of the estimated state.

22. A computer readable storage medium containing instructions which, when executed by a computer, cause the computer to carry out a method comprising:
obtaining measurement data functionally related to a state of an electrical power system, wherein the measurement data includes phasor measurements referenced to a phasor measurement reference frame and represented in polar coordinates and non-phasor measurements;
calculating an angular difference between current angle and voltage angle phasor measurements obtained at a node of the power system;
using the measurement data and the angular difference to estimate the power system state via a weighted non-linear least squares algorithm, wherein the estimation is performed in a state-estimator reference frame.

23. The computer readable storage medium of claim 22 wherein the state-estimator reference frame is referenced to a phase angle at a location in the electrical power system and the measurement reference frame is a temporal reference frame.

24. The computer readable storage medium of claim 22 wherein the state estimation and phasor measurement reference frames are temporal reference frames.

25. The computer readable storage medium of claim 22 wherein the method includes calculating, for voltage phasor measurements obtained at each of a plurality of nodes of the electrical power system, an angular difference between the voltage phasor measurement and voltage phasor measurements obtained at each of a plurality of other nodes of the electrical power system, and wherein using includes using the calculated angular differences to estimate the power system state.

26. The computer readable storage medium of claim 22 wherein the electrical power system includes first and second electrical islands, the method includes calculating angular differences between phasor measurements obtained at a plurality of locations in the first electrical island and angular differences between phasor measurements obtained at a plurality of locations in the second electrical island, and using includes using the calculated angular differences to estimate the power system state.

27. The computer readable storage medium of claim 22 wherein the method includes estimating the value of a first state variable which reconciles the state estimation and phasor measurement reference frames.

28. The computer readable storage medium of claim 27 wherein a second state variable includes a voltage magnitude and a third state variable includes a voltage phase angle.

29. The computer readable storage medium of claim 22 wherein the measurement data includes non-phasor measurement data and the method includes using the phasor measurement data and the non-phasor measurement data to estimate a best fit correlation between the phasor measurement reference frame and the state-estimator reference frame.

30. The computer readable storage medium of claim 22 wherein the power system includes first and second electrical islands, the first state variable reconciles a phasor measurement frame and a state estimation frame of the first electrical island and the method includes estimating the value of a second state variable which reconciles a phasor measurement reference frame and a state-estimator reference frame of the second electrical island.

31. The computer readable storage medium of claim 22 wherein estimating includes estimating the power system state in the measurement reference frame.

32. The computer readable storage medium of claim 31 wherein the phasor measurements are referenced to universal time coordinated.

33. The computer readable storage medium of claim 31 wherein the method includes presenting the state estimate with reference to a physical location in the electrical power system.

34. A method of electrical power system state estimation comprising:
obtaining voltage and current phasor measurements functionally related to a state of an electrical power system, wherein the voltage and current phasor measurements are referenced to a measurement reference frame;
reconciling the phasor measurement reference frame and a state-estimator reference frame;
estimating the power system state, wherein estimating includes estimating a state variable that reconciles the phasor measurement and state-estimator reference frames, wherein the state variable is a phase angle represented in polar coordinates.

35. The method of claim 34 including using an iterative estimation technique to reconcile the reference frames and estimate the state.

36. The method of claim 34 wherein the reconciliation of the reference frames and estimation of the state are performed temporally simultaneously.

37. The method of claim 34 wherein reconciling includes iteratively estimating a value of a state variable which reconciles the phasor measurement and state-estimator reference frames.

38. The method of claim 34 wherein the method includes calculating a set of pseudo-measurements which includes angular differences between phase angle measurements obtained at a plurality of different nodes of the electrical power system.

* * * * *